United States Patent
Chandra et al.

(10) Patent No.: US 10,499,492 B2
(45) Date of Patent: Dec. 3, 2019

(54) STUBBED DIFFERENTIAL TRACE PAIR SYSTEM

(71) Applicant: Dell Products L.P., Round Rock, TX (US)

(72) Inventors: Umesh Chandra, Santa Cruz, CA (US); Bhyrav M. Mutnury, Round Rock, TX (US); Mallikarjun Vasa, Secunderabad (IN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/885,337

(22) Filed: Jan. 31, 2018

(65) Prior Publication Data

US 2019/0239339 A1    Aug. 1, 2019

(51) Int. Cl.
*H05K 1/02* (2006.01)
*H04B 3/32* (2006.01)
*H04L 25/02* (2006.01)

(52) U.S. Cl.
CPC ............ *H05K 1/0245* (2013.01); *H04B 3/32* (2013.01); *H04L 25/0272* (2013.01); *H05K 1/0228* (2013.01); *H05K 1/0248* (2013.01); *H05K 2201/09227* (2013.01)

(58) Field of Classification Search
CPC ............................. H05K 1/0245; H05K 1/0248
USPC ............................................................. 333/5
See application file for complete search history.

(56) References Cited

U.S. PATENT DOCUMENTS 9,386,690 B2 *  7/2016  Ding et al. ............... H04B 3/32
2010/0327989 A1   12/2010  Abbott et al.

OTHER PUBLICATIONS

S.K. Lee ; K. Lee ; H.J. Park ; J.Y. Sim, "FEXT—Eliminated Stub-Alternated Microstrip Line for Multi-Gigabit/Second Parallel Links," Feb. 25, 2008, pp. 272-273, vol. 44, Issue 4, Institution of Engineering and Technology.
Richard Kunze, Yunhui Chu, Jason Zhenwei Yu, San K. Chhay, Mauro Lai, Yanjie Zhu, "Crosstalk Mitigation and Impedance Management Using Tabbed Lines," 2015, 5 Pages, Intel Corporation.

* cited by examiner

*Primary Examiner* — Benny T Lee
(74) *Attorney, Agent, or Firm* — Haynes and Boone, LLP

(57) ABSTRACT

A stubbed differential trace pair system includes a circuit board having a first differential trace pair with a first trace and a second trace, and a second differential trace pair with a third trace and a fourth trace, where the first trace located opposite the second trace and the third trace from the fourth trace. Second trace stubs extend in a spaced apart orientation relative to each other and from a side of the second trace that is opposite the second trace from the first trace. Third trace stubs extend in a spaced apart orientation relative to each other and from a side of the third trace that is opposite the third trace from the fourth trace. The second trace stubs and the third trace stubs are configured to reduce crosstalk generated by the transmission of signals through the first differential trace pair and the second differential trace pair.

17 Claims, 10 Drawing Sheets

the use of

STUBBED DIFFERENTIAL TRACE PAIR SYSTEM

BACKGROUND

The present disclosure relates generally to information handling systems, and more particularly to the use of stubs on differential trace pairs in an information handling system in order to reduce crosstalk between adjacent differential trace pairs.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems include high speed buses for routing information, and as speeds have increased, transmission line routing imperfections that were previously considered low risk have become an issue. For example, high speed information transmission typically uses differential signaling techniques that operate to transmit information from a sender device using two complementary signals that provide the same signal as a "differential pair" of traces that are provided on a circuit board and that reference each other. The receiving device responds to the electrical differences between the two signals provided using such differential trace pairs, rather than the difference between a single trace and ground (a technique called single-ended signaling). The use of differential trace pairs has traditionally minimized crosstalk and electromagnetic interference (both noise emission and noise acceptance), and can achieve a constant or known characteristic impedance, which allows for impedance matching techniques that allow for high speed transmissions of information over the differential trace pairs.

However, as the transmission speeds over such differential trace pairs have increased, problems associated with crosstalk has become more and more prevalent. Crosstalk is a phenomenon in which signal integrity is compromised when adjacent differential trace pairs are switching and noise from one differential trace pair couples to an adjacent differential trace pair. For example, microstrip structures (e.g., differential trace pairs routed on a top or bottom layer of a printed circuit board) are known to exhibit high amounts of far-end crosstalk, and have resulted in most high speed signal routing on circuit boards utilizing stripline structures (e.g., differential trace pairs routed within the circuit board between its top and bottom surface.) However, the use of stripline structures can lead to an increase in the number of signal layers in the circuit board and the resulting increases in circuit board cost. In order to avoid crosstalk, differential trace pairs are typically spaced as far apart as possible (e.g., a general rule is to space them by a distance of at least five times the thickness of their dielectric), but as circuit boards become denser and/or circuit board costs reduction becomes desirable, differential trace pairs have been positioned closer and closer to each other on the circuit board (in both microstrip and stripline structure). At such relatively close spacing, both microstrip and stripline structures exhibit increases in crosstalk.

Accordingly, it would be desirable to provide for improved crosstalk performance for high speed differential pair traces.

SUMMARY OF THE INVENTION

According to one embodiment, an information handling system (IHS) includes a chassis; a circuit board housed in the chassis; a processing system mounted to the circuit board; a memory system mounted to the circuit board and coupled to the processing system; a first differential trace pair that includes a first trace and a second trace and that is located on the circuit board; a plurality of second trace stubs that extend in a spaced apart orientation relative to each other and from a side of the second trace that is opposite from the first trace; a second differential trace pair that includes a third trace and a fourth trace and that is located on the circuit board adjacent the first differential trace pair such that the second trace and the third trace are located between the first trace and the fourth trace; and a plurality of third trace stubs that extend in a spaced apart orientation relative to each other and from a side of the third trace that is opposite from the fourth trace, wherein the plurality of second trace stubs and the plurality of third trace stubs are configured to reduce crosstalk generated by the transmission of signals through the first differential trace pair and the second differential trace pair.

DETAILED DESCRIPTION OF THE INVENTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, Read Only Memory (ROM), and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
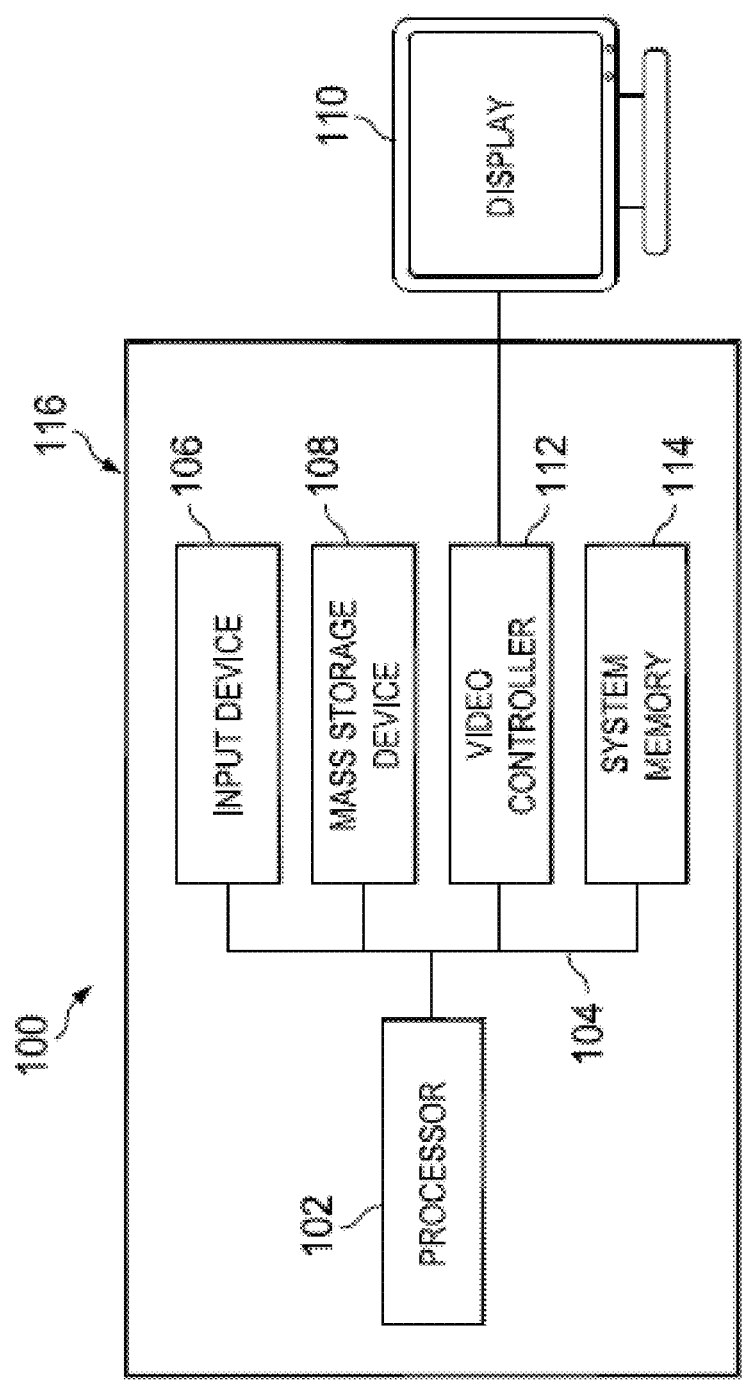
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
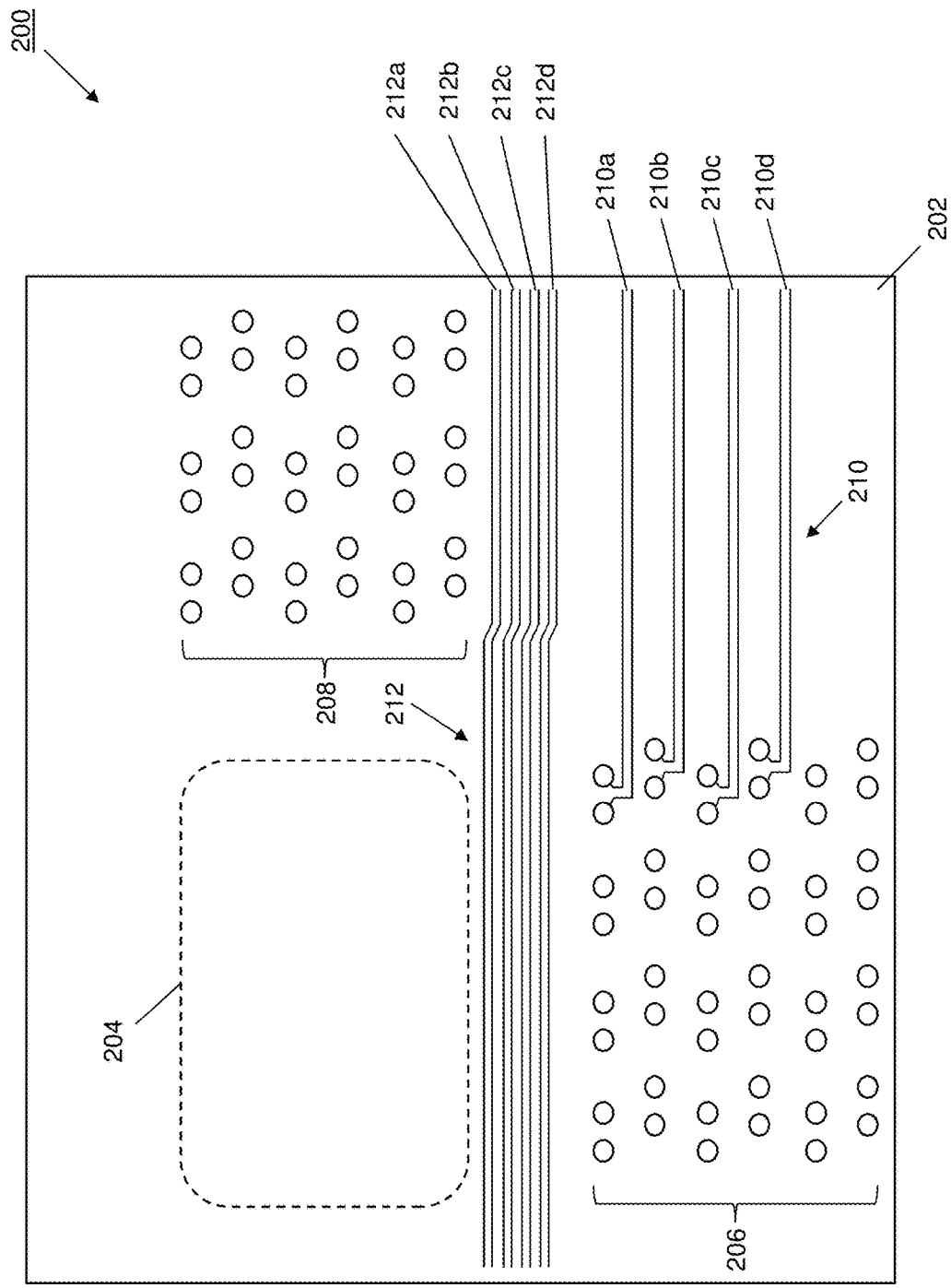
FIG. 2 is a top or cross-sectional view illustrating an embodiment of a circuit board.

Referring now to FIG. 2, an embodiment of a stubbed differential trace pair system 200 is illustrated that may be provided, for example, in the IHS 100 discussed above with reference to FIG. 1. The stubbed differential trace pair system 200 includes a circuit board 202 (a portion of which is illustrated in FIG. 2) that may be provided by a motherboard, a card, and/or a variety of other board or differential-trace-pair-supporting structures that would be apparent to one of skill in the art in possession of the present disclosure. As would be understood by one of skill in the art, the view of the circuit board 202 FIG. 2 may be either top/bottom view (e.g., a view looking at a top surface or bottom surface of the circuit board 200), or a cross-sectional view (e.g., a view looking at a layer of the circuit board 202 that is located between a top surface and bottom surface of the circuit board 202.) As such, the teachings of the present disclosure may be applied to microstrip structures (e.g., differential trace pairs routed on a top or bottom surface of a circuit board 202), stripline structures (e.g., differential trace pairs routed in inner layers of a printed circuit board and such as, for example, between the top and bottom surface of the circuit board 202), and/or other differential trace pair structures that would be apparent to one of skill in the art in possession of the present disclosure.

In the illustrated embodiment, the circuit board includes a board structure 204 that may be, for example, a mounting structure for a processing system (e.g., a processing system that includes the processor 102 discussed above with reference to FIG. 1) and/or a memory system (e.g., a memory system that includes the memory 114 discussed above with reference to FIG. 1), an airflow opening for ensuring cooling of components on or adjacent the circuit board 202, and/or a variety of other board elements that one of skill in the art in possession of the present disclosure would recognize would prevent the routing of traces through that portion of the circuit board 202. The circuit board 202 also includes a first plurality of board connection elements 206 and a second plurality of board connection elements 208 that may include connection pads, vias, and/or other board connections elements that would be apparent to one of skill in the art in possession of the present disclosure. To provide a specific example, while not illustrated as connected to other components, the second plurality of board connection elements 208 may include connections to each of a processing system mounting structure (e.g., provided as the board structure 204) and a memory system mounting structure (not illustrated), although other connection configurations will fall within the scope of the present disclosure as well.

In the illustrated embodiment, a first plurality of differential trace pairs 210 (e.g., differential trace pairs 210a, 210b, 210c, and 210d) are illustrated in a "non-congested routing configuration", connected to some of the board connection elements 206 and routed to a location on the circuit board 202 that is not illustrated. In addition, a second plurality of differential trace pairs 212 (e.g., differential trace pairs 212a, 212b, 212c, and 212d) are illustrated in a "congested routing configuration", routed adjacent the board connection elements 208 and between the board structure 204 and the board connection elements 206. As can be seen in FIG. 2, the non-congested routing configuration of the first plurality of differential trace pairs 210 may be provided when there is area available on the circuit board 202 to space apart each set of the differential trace pairs 210a, 210b, 210c, and 210d from each other by some minimum distance, while the congested routing configuration of the second plurality of differential trace pairs 212 may be provided when the area available on the circuit board 202 is not sufficient to space apart each set of the differential trace pairs 212a, 212b, 212c, and 212d from each other by some minimum distance.

In the specific examples illustrated and described below, the routing of the first plurality of differential trace pairs 210 is considered non-congested based on the spacing between the sets of the differential trace pairs 210a, 210b, 210c, and 210*d* being five times the dielectric thickness (e.g., the distance between the each different trace pair and a reference plane (e.g., a ground plane) in the circuit board 202), although other differential trace pair spacing distances may provide non-congested routing configurations while remaining within the scope of the present disclosure. Furthermore, in the specific examples illustrated and described below, the routing of the second plurality of differential trace pairs 212 is considered congested based on the spacing between the sets of the differential trace pairs 212*a*, 212*b*, 212*c*, and 212*d* being two times the dielectric thickness, although other differential trace pair spacing distances may provide congested routing configurations while remaining within the scope of the present disclosure. While specific examples are provided herein, one of skill in the art in possession of the present disclosure will recognize that congestion routing may exist with a variety of different differential trace pair spacings and may result in increased amounts of crosstalk (as discussed above) without utilization of the teachings of the present disclosure.

Figure 3:
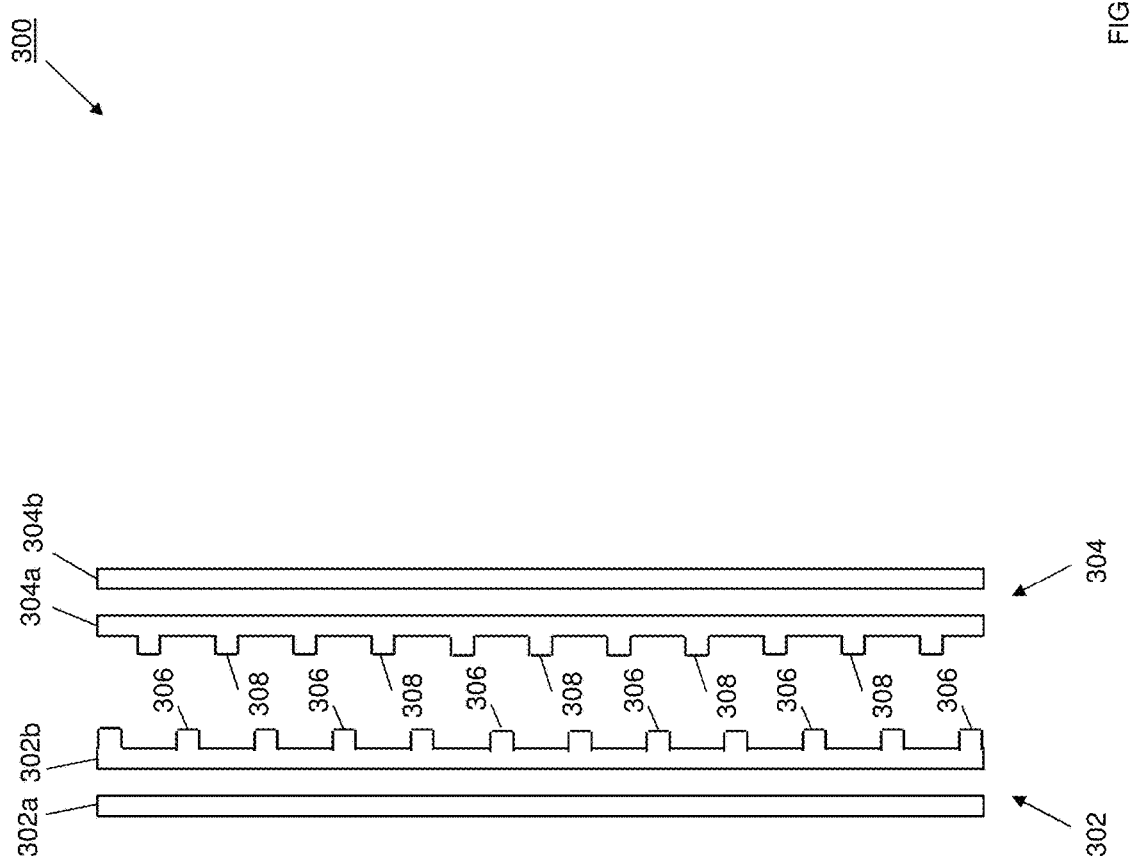
FIG. 3 is a top view illustrating an embodiment of a stubbed differential trace pair system that may be provided on the circuit board of FIG. 2.

Referring now to FIG. 3, an embodiment of a set of differential trace pairs 300 is illustrated that may be, for example, any two adjacent differential pairs provided in the second plurality of differential trace pairs 212 that are in the congestion routing configuration illustrated in FIG. 2 (e.g., the differential trace pair 212*a* and the differential trace pair 212*b*, the differential trace pair 212*b* and the differential trace pair 212*c*, or the differential trace pair 212*c* and the differential trace pair 212*d*). For the purposes of the discussion below, the set of differential trace pairs 300 include a first differential trace pair 302 having a first trace 302*a* and a second trace 302*b*, and a second differential trace pair 304 having a third trace 304*a* and a fourth trace 304*b*. One of skill in the art in possession of the present disclosure will recognize that the naming convention of the traces (i.e., "first", "second", "third", and "fourth") is provided for clarity of discussion, and should not be interpreted as requiring any ordering or priority not described below. In an embodiment, the first differential trace pair 302 may be considered to be "tightly coupled" because it is configured such that at least 90% of the signals transmitted on the first trace 302*a* return on the second trace 302*b*, and the second differential trace pair 304 may be considered to be "tightly coupled" because it is configured such that at least 90% of the signals transmitted on the third trace 304*a* return on the fourth trace 304*b*.

As can be seen in FIG. 3, the first differential trace pair 302 and the second differential trace pair 304 are positioned adjacent each other (e.g., with a spacing of two times the dielectric thickness as detailed in FIG. 2) such that the first trace 302*a* is located opposite the second trace 302*b* from the second differential trace pair 304, and the fourth trace 304*b* is located opposite the third trace 304*a* from the first differential trace pair 302. The second trace 302*b* includes a plurality of second trace stubs 306 that extend in a spaced apart orientation relative to each other towards the third trace 304*a* and from a side of the second trace 302*b* that is opposite the second trace 302*b* from the first trace 302*a*. The third trace 304*a* includes a plurality of third trace stubs 308 that extend in a spaced apart orientation relative to each other towards the second trace 302*b* and from a side of the third trace 304*a* that is opposite the third trace 304*a* from the fourth trace 304*b*. As can be seen, the second trace stubs 306 and the third trace stubs 308 each include a substantially flat distal end (which is located opposite the respective trace from which they extend).

The dimensions, spacing, and/or other characteristics of the first trace stubs 306 and the second trace stubs 308 may be selected in order to provide the functionality described below that configures the first trace stubs 306 and the second trace stubs 308 to reduce crosstalk that is generated by the transmission of signals through the first differential trace pair 302 and the second differential trace pair 304 (and that would exist in the absence of the first trace stubs 306 and the second trace stubs 308.) For example, as discussed above, the configuration of the first trace stubs 306 and the second trace stubs 308 illustrated in FIG. 3 has been found to be particularly beneficial in reducing crosstalk in adjacent differential trace pairs that are each tightly coupled (i.e., at least 90% of the signals transmitted on one of the traces in that differential trace pair returns on the other traces in the differential trace pair.)

Furthermore, the dimensions of any of the first trace stubs 306 and the second trace stubs 308 to provide for the reduced crosstalk may depend on the cross section of the circuit board 202. In a specific example, for differential trace pairs with a trace width of 5.5 millimeters and a spacing of 5.5 millimeters, the stubs may be provided with a width of 5.5 millimeters and a length that may vary from 1 millimeter to 10 millimeters depending on the spacing of between the different trace pairs. Furthermore, it has been found that trace stubs having a length (measured perpendicularly from the trace from which they extend) of approximately 2 millimeters will not impact high speed signals up to 100 GHz, although other trace stub dimensions may be utilized while remaining within the scope of the present disclosure. Further still, while specific examples have been provided, one of skill in the art in possession of the present disclosure will recognize that differential trace pair stubs provided according to the teachings of the present disclosure may have a variety of different characteristics depending on the details of the circuit board, the differential trace pairs, and/or other features in the system while remaining within the scope of the present disclosure.

Figure 4:
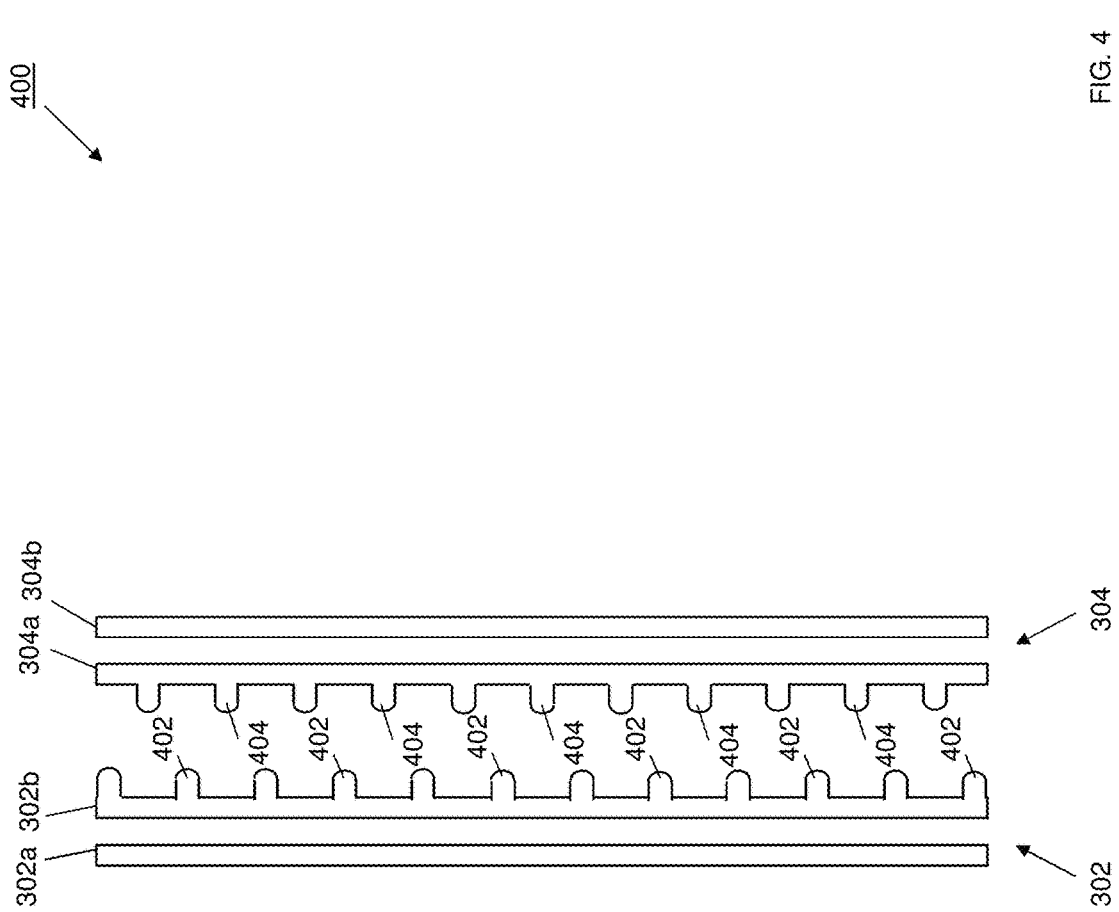
FIG. 4 is a top view illustrating an embodiment of a stubbed differential trace pair system that may be provided on the circuit board of FIG. 2.

Referring now to FIG. 4, an embodiment of a set of differential trace pairs 400 is illustrated that may be, for example, any two adjacent differential pairs provided in the second plurality of differential trace pairs 212 that are in the congestion routing configuration illustrated in FIG. 2 (e.g., the differential trace pair 212*a* and the differential trace pair 212*b*, the differential trace pair 212*b* and the differential trace pair 212*c*, or the differential trace pair 212*c* and the differential trace pair 212*d*). For the purposes of the discussion below, the set of differential trace pairs 400 is substantially similar to the set of differential trace pairs 300 (i.e., including the first differential trace pair 302 having the first trace 302*a* and the second trace 302*b*, and the second differential trace pair 304 having the third trace 304*a* and the fourth trace 304*b*), but with the second trace 302*b* including a plurality of second trace stubs 402 that replace the plurality of second trace stubs 306 illustrated in FIG. 3, and the third trace 304*a* including a plurality of third trace stubs 404 that replace the plurality of second trace stubs 308 illustrated in FIG. 3. As can be seen, the second trace stubs 402 and the third trace stubs 404 each include a substantially semicircular distal end (which is located opposite the respective trace from which they extend). As discussed in further detail below, the second trace stubs 402 and the third trace stubs 404 provide a higher surface area that may be beneficial for differential trace pair sets when a primary crosstalk generated in response to providing high speed signals through the differential trace pairs includes a relatively high inductive current.

Figure 5:
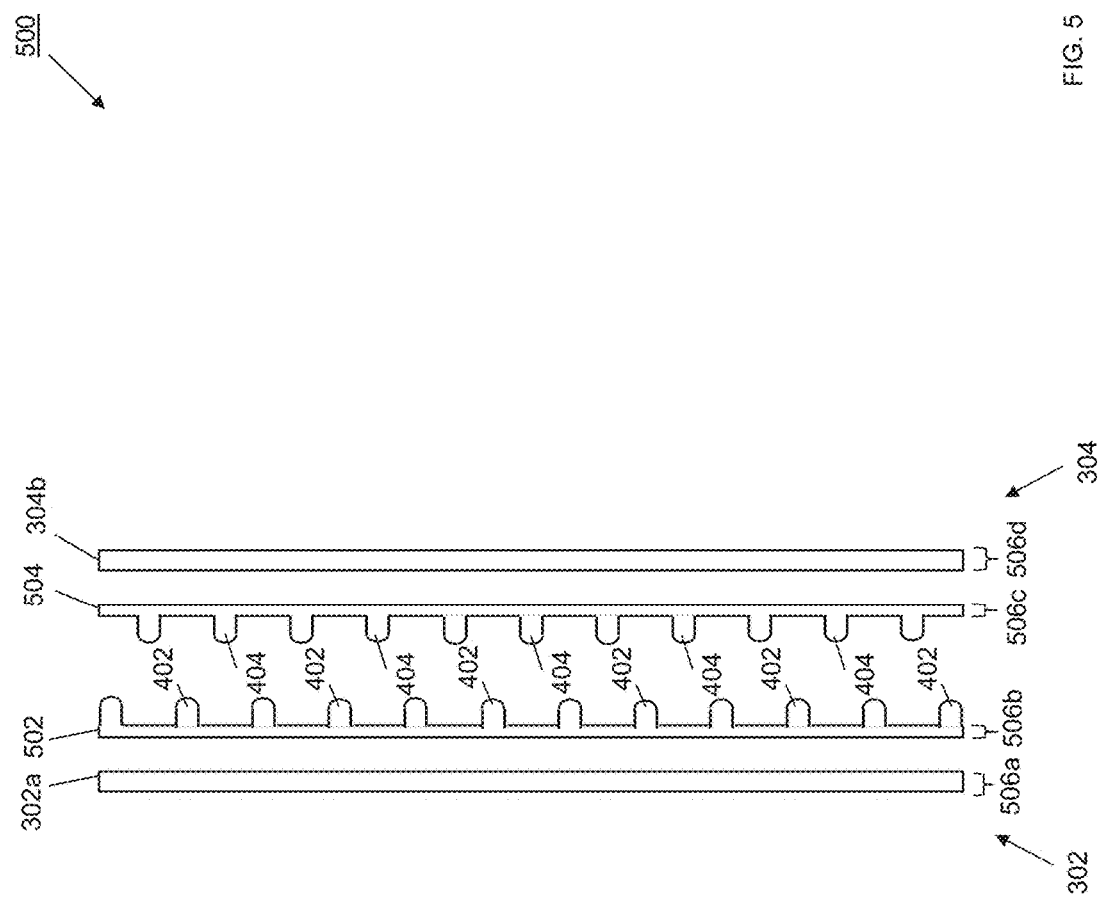
FIG. 5 is a top view illustrating an embodiment of a stubbed differential trace pair system that may be provided on the circuit board of FIG. 2

Referring now to FIG. 5, an embodiment of a set of differential trace pairs 500 is illustrated that may be, for example, any two adjacent differential pairs provided in the second plurality of differential trace pairs 212 that are in the congestion routing configuration illustrated in FIG. 2 (e.g., the differential trace pair 212a and the differential trace pair 212b, the differential trace pair 212b and the differential trace pair 212c, or the differential trace pair 212c and the differential trace pair 212d). For the purposes of the discussion below, the set of differential trace pairs 500 is substantially similar to the set of differential trace pairs 400 (i.e., including the first differential trace pair 302 having the first trace 302a, and the second differential trace pair 304 having the fourth trace 304b), but with a second trace 502 that includes the second trace stubs 402 replacing the second trace 302b illustrated in FIG. 4, and a third trace 504 that includes the third trace stubs 404 replacing the third trace 304a illustrated in FIG. 4. As can be seen, the second trace 502 and the third trace 504 are thinner than their respective first trace 302a and fourth trace 304b illustrated in FIG. 4. As discussed in further detail below, providing the second trace 502 with a second width 506b that is different than a first width 506a of the first trace 302a in the first differential trace pair 302, and providing the third trace 504 with a third width 506c that is different than a fourth width 506d of the fourth trace 304b in the second differential trace pair 304, may compensate for impedance increases that result from the inclusion of the second trace stubs 402 and the third trace stubs 404 on the second trace 502 and the third trace 504, respectively.

Figure 6:
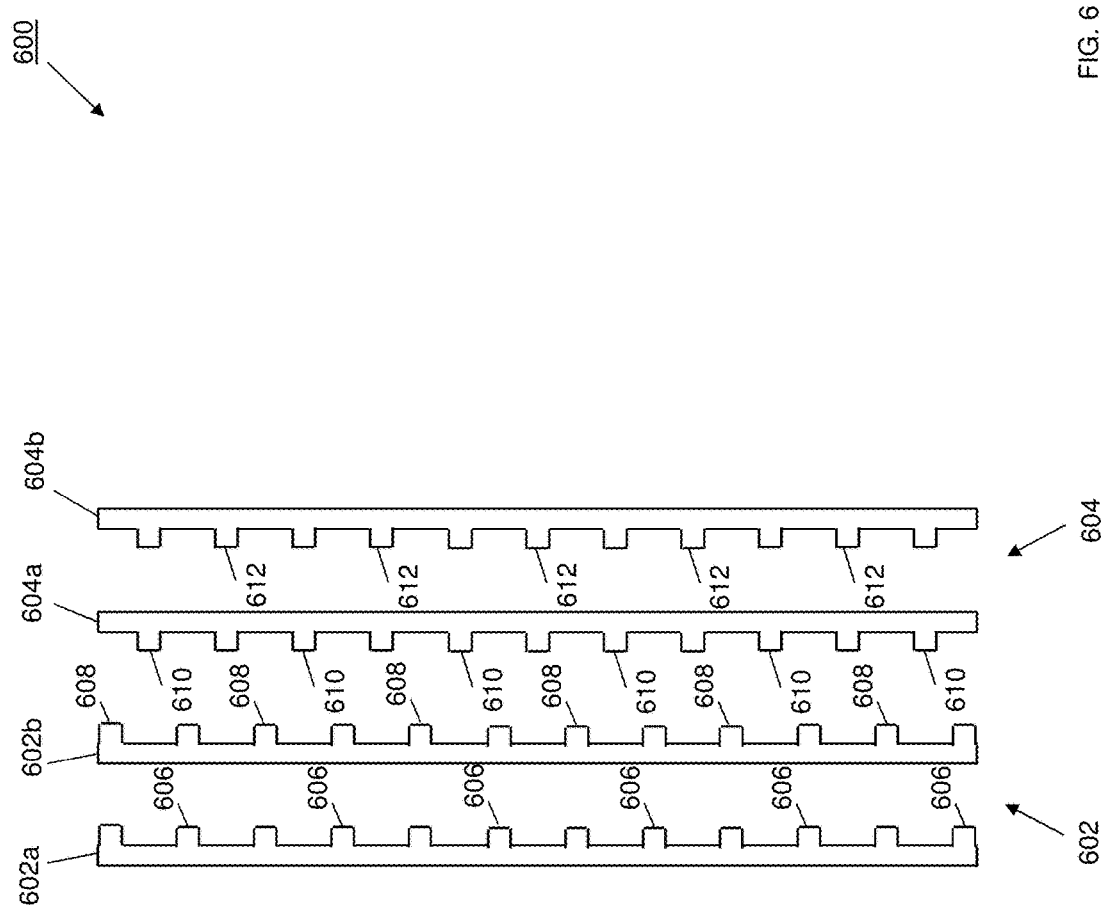
FIG. 6 is a top view illustrating an embodiment of a stubbed differential trace pair system that may be provided on the circuit board of FIG. 2

Referring now to FIG. 6, an embodiment of a set of differential trace pairs 600 is illustrated that may be, for example, any two adjacent differential pairs provided in the second plurality of differential trace pairs 212 that are in the congestion routing configuration illustrated in FIG. 2 (e.g., the differential trace pair 212a and the differential trace pair 212b, the differential trace pair 212b and the differential trace pair 212c, or the differential trace pair 212c and the differential trace pair 212d). For the purposes of the discussion below, the set of differential trace pairs 600 include a first differential trace pair 602 having a first trace 602a and a second trace 602b, and a second differential trace pair 604 having a third trace 604a and a fourth trace 604b. One of skill in the art in possession of the present disclosure will recognize that the naming convention of the traces (i.e., "first", "second", "third", and "fourth") is provided for clarity of discussion, and should not be interpreted as requiring any ordering or priority not described below. In an embodiment, the first differential trace pair 602 may be considered to be "loosely coupled" because it is configured such that 50% or less of the signals transmitted on the first trace 602a return on the second trace 602b, and the second differential trace pair 604 may be considered to be "loosely coupled" because it is configured such that 50% or less of the signals transmitted on the third trace 604a return on the fourth trace 604b.

As can be seen in FIG. 6, the first differential trace pair 602 and the second differential trace pair 604 are positioned adjacent each other (e.g., with a spacing of two times the dielectric thickness as detailed in FIG. 2) such that the first trace 602a is located opposite the second trace 602b from the second differential trace pair 604, and the fourth trace 604b is located opposite the third trace 604a from the first differential trace pair 602. The first trace 602a includes a plurality of first trace stubs 606 that extend in a spaced apart orientation relative to each other towards the second trace 602b. The second trace 602b includes a plurality of second trace stubs 608 that extend in a spaced apart orientation relative to each other towards the second differential trace pair 604 and from a side of the second trace 602b that is opposite the second trace 602b from the first trace 602a. The third trace 604a includes a plurality of third trace stubs 610 that extend in a spaced apart orientation relative to each other towards the first differential trace pair 602 and from a side of the third trace 604a that is opposite the third trace 604a from the fourth trace 604b. The fourth trace 604b includes a plurality of fourth trace stubs 612 that extend in a spaced apart orientation relative to each other towards the third trace 604a. In the illustrated embodiment, the first trace stubs 606, second trace stubs 608, third trace stubs 610, and fourth trace stubs 612 each include a substantially flat distal end (which are located opposite the respective trace from which they extend). However, in some embodiments, the first trace stubs 606, second trace stubs 608, third trace stubs 610, and fourth trace stubs 612 may include distal ends with the semi-circular shapes discussed above, or other shapes that would be apparent to one of skill in the art in possession of the present disclosure.

The dimensions, spacing, and/or other characteristics of the first trace stubs 606, second trace stubs 608, third trace stubs 610, and fourth trace stubs 612 are selected in order to provide the functionality described below that configures the first trace stubs 606, second trace stubs 608, third trace stubs 610, and fourth trace stubs 612 to reduce crosstalk that is generated by the transmission of signals through the first differential trace pair 602 and the second differential trace pair 604 (and that would exist in the absence of the first trace stubs 606, second trace stubs 608, third trace stubs 610, and fourth trace stubs 612.) For example, as discussed above, the configuration of the first trace stubs 606, second trace stubs 608, third trace stubs 610, and fourth trace stubs 612 illustrated in FIG. 6 has been found to be particularly beneficial in reducing crosstalk in adjacent differential trace pairs that are loosely coupled (i.e., 50% or less of the signals transmitted on one of the traces in that differential trace pair returns on the other traces in the differential trace pair.)

Furthermore, the dimensions any of the first trace stubs 606, second trace stubs 608, third trace stubs 610, and fourth trace stubs 612 to provide for the reduced crosstalk may depend on the cross section of the circuit board 202. In a specific example, for a differential trace pairs with a trace width of 5.5 millimeters and a spacing of 5.5 millimeters, the stubs may be provided with a width of 5.5 millimeters and a length that may vary from 1 millimeter to 10 millimeters depending on the spacing of between the different trace pairs. Furthermore, it has been found that trace stubs having a length (measured perpendicularly from the trace from which they extend) of approximately 2 millimeters will not impact high speed signals up to 100 GHz, although other trace stub dimensions may be utilized while remaining within the scope of the present disclosure. However, while a specific example has been provided, one of skill in the art in possession of the present disclosure will recognize that differential trace pair stubs provided according to the teachings of the present disclosure may have a variety of different characteristics depending on the details of the circuit board, the differential trace pairs, and/or other features in the system while remaining within the scope of the present disclosure.

Figure 7:
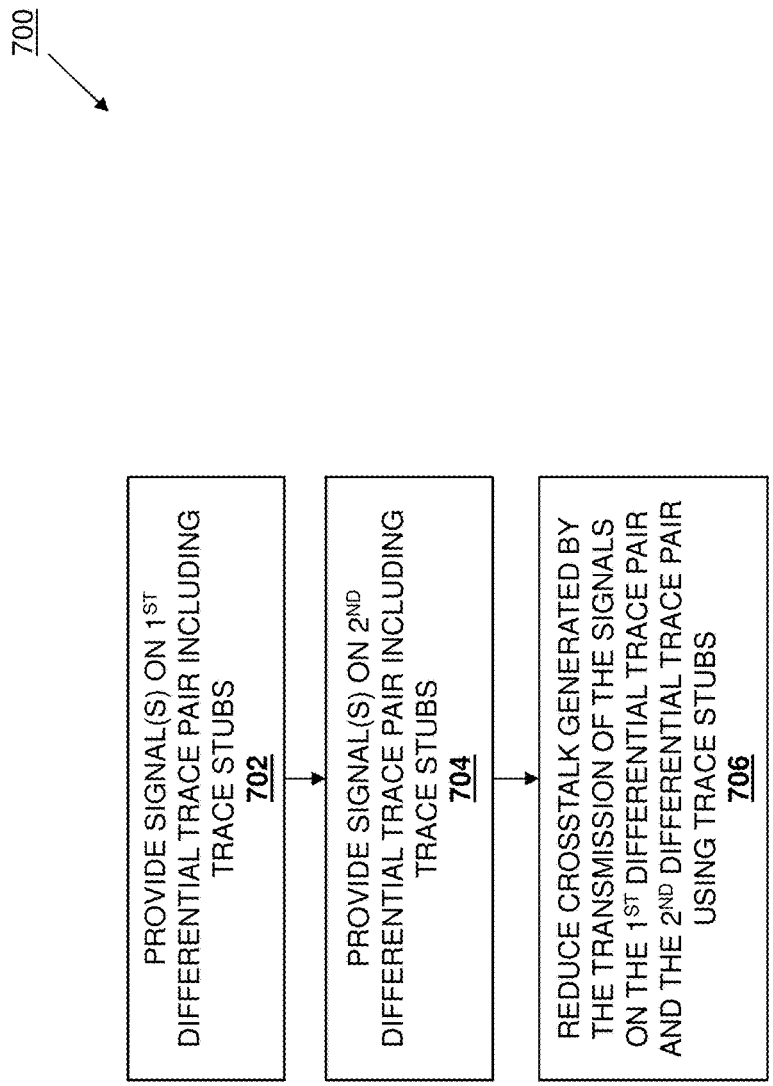
FIG. 7 is a flow chart illustrating an embodiment of a method for providing high speed transmission on stubbed different trace pairs.

Referring now to FIG. 7, a method 700 for providing high speed transmission on stubbed differential trace pairs is illustrated. As discussed above, the systems and methods of the present disclosure provide for the high speed transmission of signals through differential trace pairs that are relatively closely spaced to each other using trace stubs on at least one of the traces in each differential trace pair that operate to reduce crosstalk that would otherwise be generated by the high speed signal transmission through the closely spaced differential trace pairs. As discussed in more detail below, the stubs operate to introduce a secondary crosstalk that negates a primary crosstalk generated by the high speed transmission of signals through the closely spaced differential trace pairs, resulting in a lower total crosstalk generated in response to high speed signal transmission, and the size, dimensions, and/or other characteristics of the stubs may be selected based on the system details (e.g., circuit board features, differential trace pair features, etc.) to "tune" the secondary crosstalk to minimize the total crosstalk generated when signals are transmitted through the closely spaced differential trace pairs. As such, the teachings of the present disclosure enable closer spacing of differential trace pairs with reduced crosstalk relative to conventional systems, allowing for denser circuit boards, circuit boards with fewer layers (i.e., due to the ability to utilize microstrip structures rather than stripline structure), and/or other benefits that would be apparent to one of skill in the art in possession of the present disclosure.

Figure 8:
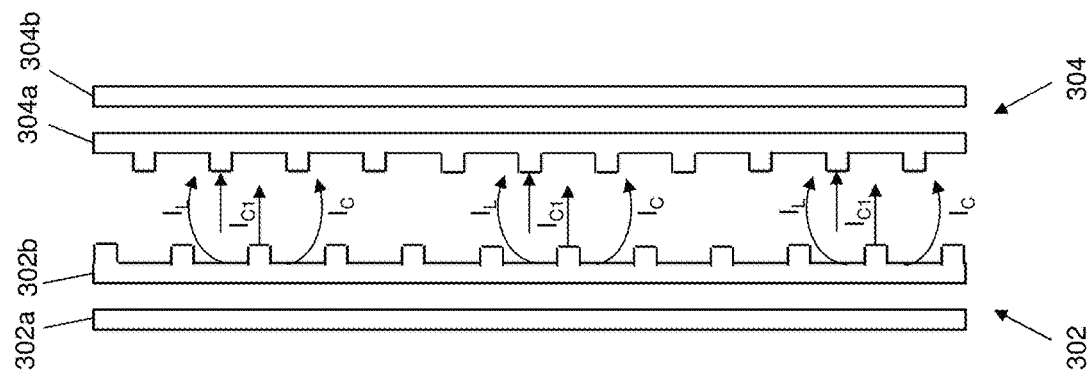
FIG. 8 is a schematic view illustrating the reduction in total crosstalk in the stubbed differential trace pair system of FIG. 3.

The method 700 begins at blocks 702 and 704 where signal(s) are provided on a first differential trace pair that includes trace stubs, and signals are provided on a second differential trace pair that includes trace stubs, respectively. With reference to FIGS. 3 and 8, in an embodiment of block 702, the first differential trace pair 302 and the second differential trace pair 304 are provided in a congested routing configuration (e.g., as any two of the adjacent differential trace pairs 212a-d on the circuit board 202 in FIG. 2), and signals may be transmitted between sender and receiver devices coupled to opposite ends of the first differential trace pair 302 and the second differential trace pair 304. As would be understood by one of skill in the art in possession of the present disclosure, such differential signaling on any particular differential trace pair operates by the sender device providing two complementary voltage signals on each trace in the differential trace pair in order to transmit one information signal—a first trace carries the signal, and a second trace carried an inverted form of the signal. The receiver device extracts information sent through the differential trace pair by detecting the potential difference between the inverted and non-inverted signals.

However, as illustrated in FIG. 8, when the differential trace pairs are relatively closely spaced (e.g., two times the dielectric thickness as discussed above), the transmission of high speed signals through the first differential trace pair 302 that includes the first trace 302a and the second trace 302b and the second differential trace pair 304 that includes the third trace 304a and the fourth trace 304b induces a primary capacitive current ($I_C$) that is proportional to a primary mutual capacitive coupling ($C_M$) between the first differential trace pair 302 and the second differential trace pair 304 and a primary self-capacitive coupling ($C_S$) between the first differential trace pair 302 and the second differential trace pair 304:

$$I_C \alpha C_M \text{ and } C_S$$

In addition, the transmission of high speed signals through the first differential trace pair 302 and the second differential trace pair 304 induces an inductive current ($I_L$) that is proportional to a mutual inductive coupling ($L_M$) between the first differential trace pair 302 and the second differential trace pair 304 and a self-inductive coupling ($L_S$) between the first differential trace pair 302 and the second differential trace pair 304:

$$I_L \alpha L_M \text{ and } L_S$$

Thus, the primary crosstalk that would be generated between the first differential trace pair 302 and the second differential trace pair 304 in response to high speed signal transmission in the absence of the second trace stubs 306 and the third trace stubs 308 is proportional to the difference between the ratio of the primary mutual capacitive coupling ($C_M$) and the primary self-capacitive coupling ($C_S$) and the ratio of the mutual inductive coupling ($L_M$) and the self-inductive coupling ($L_S$):

$$\text{Primary crosstalk } \alpha (C_M/C_S)-(L_M/L_S)$$

The method 700 illustrated in FIG. 7 then proceeds to block 706 where crosstalk generated by the transmission of the signals on the first differential trace pair and the second differential trace pair is reduced using the trace stubs. With reference to FIGS. 3 and 8, in an embodiment of block 704, the configuration of the second trace stubs 306 and the third trace stubs 308 operates to introduce, in response to the high speed transmission of signals through the first differential trace pair 302 and the second differential trace pair 304, a secondary crosstalk that negates at least a portion of the primary crosstalk. As would be understood by one of skill in the art in possession of the present disclosure, the ratio of the mutual inductive coupling and the self-inductive coupling ($L_M/L_S$) typically dominates the ratio of the primary mutual capacitive coupling and the primary self-capacitive coupling ($C_M/C_S$) with regard to the generation of the primary crosstalk discussed above. It has been found that the use of trace stubs such as the second trace stubs 306 and the third trace stubs 308 in the embodiments illustrated in FIGS. 3 and 8 operate, in response to the transmission of high speed signals through the first differential trace pair 302 and the second differential trace pair 304, to induce a secondary capacitive current ($I_{C1}$) that is proportional to a secondary mutual capacitive coupling ($C_{M1}$) of each stub and a secondary self-capacitive coupling ($C_{S2}$) of each stub:

$$I_C \alpha C_{M1} \text{ and } C_{S1}$$

One of skill in the art in possession of the present disclosure will recognize that the stubs may introduce inductance increases, but such increases will typically be negligible and may be ignored for the purposes of the present disclosure.

Thus, the second trace stubs 306 and the third trace stubs 308 may be configured to generate a secondary crosstalk that has a value that is primarily the ratio of the secondary mutual capacitive coupling ($C_{M1}$) and the secondary self-capacitive coupling ($C_{S1}$), and which results in a generation of a total crosstalk (i.e., the sum of the primary crosstalk and the secondary crosstalk) that is proportional to the difference between: 1) the ratio of the mutual inductive coupling ($L_M$) and the self-inductive coupling ($L_S$) and 2) the sum of the ratio of the primary mutual capacitive coupling ($C_M$) and primary self-capacitive coupling ($C_S$) and the secondary mutual capacitive coupling ($C_{M1}$) and the secondary self-capacitive coupling ($C_{S2}$):

$$\text{Total crosstalk } \alpha (C_M/C_S)+(C_{M1}/C_{S1})-(L_M/L_S)$$

Thus, the secondary crosstalk produced by the second trace stubs 306 and the third trace stubs 308 is primarily made up of the ratio of the secondary mutual capacitive coupling and the secondary self-capacitive coupling ($C_{M1}$/

$C_{S1}$), and operates to negate more of the ratio of the mutual inductive coupling and the self-inductive coupling ($L_M/L_S$) (which typically dominates the ratio of the primary mutual capacitive coupling and the primary self-capacitive coupling ($C_M/C_S$) with regard to the generation of the primary crosstalk) in order to reduce the total crosstalk generated in response to high speed transmission of signals through the first differential trace pair 302 and the second differential trace pair 304. As would be understood by one of skill in the art in possession of the present disclosure, the primary inductive current ($I_L$) will increase as the first differential trace pair 302 and the second differential trace pair 304 are positioned closer together, and the second trace stubs 306 and the third trace stubs 308 may be sized/dimensioned to produce a secondary capacitive current ($I_{C1}$) that will operate to produce a secondary crosstalk that negates as much of the resulting primary crosstalk as is possible to reduce the total crosstalk generated between the first differential trace pair 302 and the second differential trace pair 304.

Figure 9A:
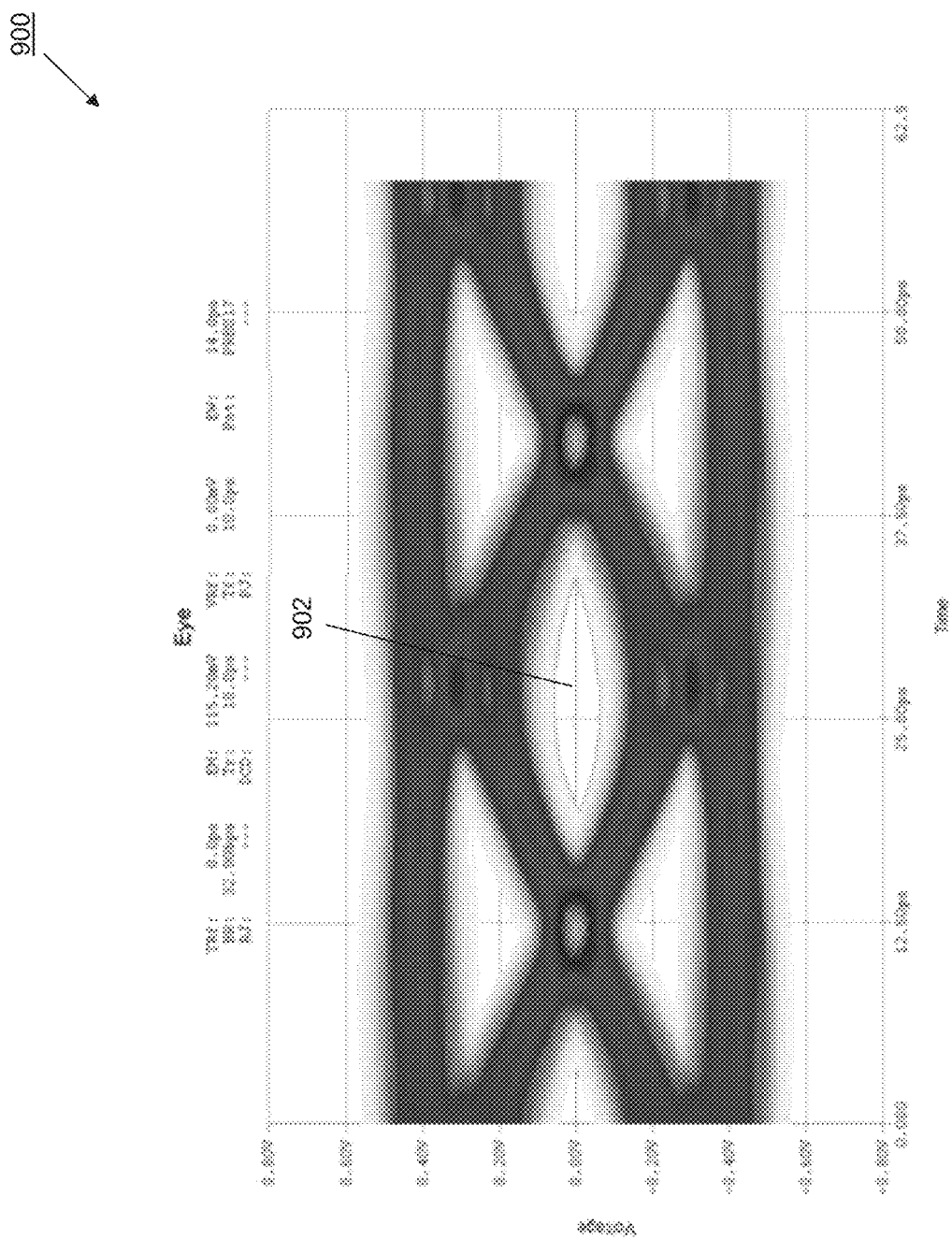
FIG. 9A is a chart illustrating an embodiment of an eye pattern resulting from transmission of signals on a conventional differential trace pair system.
Figure 9B:
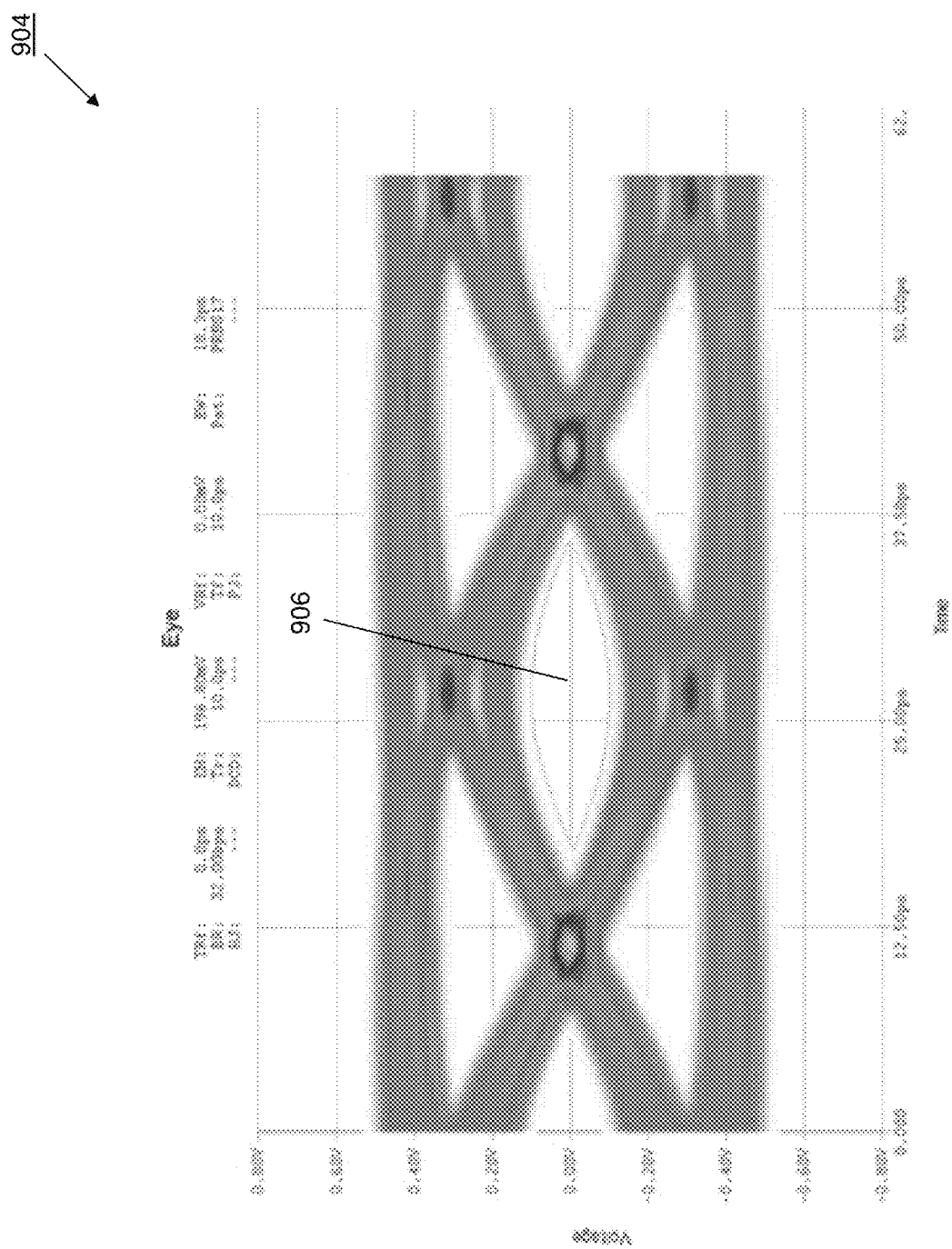
FIG. 9B is a chart illustrating an embodiment of an eye pattern resulting from transmission of signals on a stubbed differential trace pair system according to the teachings of the present disclosure.

With reference to FIGS. 9A and 9B, charts illustrating experimental embodiments of the present disclosure are provided to illustrate some benefits that may be realized using the teachings of the present disclosure. FIG. 9A includes a chart 900 of voltage versus time illustrating an embodiment of an eye pattern 902 resulting from high speed transmission of signals on a conventional differential trace pair system with differential trace pairs separated by a distance equal to five times their dielectric thickness, while FIG. 9B includes a chart 904 of voltage versus time illustrating an embodiment of an eye pattern 906 resulting from transmission of signals on a stubbed differential trace pair system according to the teachings of the present disclosure with differential trace pairs separated by a distance equal to three times their dielectric thickness. One of skill in the art in possession of the present disclosure will recognize that the eye pattern 906 illustrates a larger "opening" relative to the eye pattern 902 (which was measured to be more than a 30% increase in the experimental embodiments).

With reference to set of differential trace pairs 400 in FIG. 4, the second trace stubs 402 and the third trace stubs 404 operate in substantially the same manners as the second trace stubs 306 and the third trace stubs 308 discussed above, but with the exception that the semi-circular distal ends of the second trace stubs 402 and the third trace stubs 404 includes an increased area (relative to the distal ends of the second trace stubs 306 and the third trace stubs 308) that generates additional secondary crosstalk (relative to that generated by the second trace stubs 306 and the third trace stubs 308). As such, the trace stub configuration illustrated in FIG. 4 may be utilized in situations where the primary crosstalk is generated by a relatively high primary inductive current ($I_L$) that results from the high speed transmission of signals through the first differential trace pair 302 and the second differential trace pair 304.

With reference to set of differential trace pairs 500 in FIG. 5, the second trace 502 and the third trace 504 operate in substantially the same manners the second trace 302b and the third trace 304a discussed above, but with the exception that the second trace 502 and the third trace 504 are thinner, both relative to the second trace 302b and the third trace 304a discussed above, as well as relative to the first trace 302a and the fourth trace 304b in the set of differential trace pairs 500. The trace configuration illustrated in FIG. 5 may be utilized in situations where second trace stubs 402 and the third trace stubs 404 produce impedance increases, and may allow for ultra-high frequency speeds.

With reference to set of differential trace pairs 600 in FIG. 6, the first trace stubs 606, the second trace stubs 608, the third trace stubs 610, and the fourth trace stubs 612 operate in substantially the same manner as the second trace stubs 306 and the third trace stubs 308 discussed above, but provide a trace stub configuration (e.g., the first trace 602a includes first trace stubs 606 while the first trace 302a is free of stubs, and the fourth trace 604b includes fourth trace stubs 612 while the fourth trace 304b is free of stubs) that has been found to be particularly beneficial for loosely coupled differential trace pairs (i.e., 50% or less of the signals transmitted on one of the traces in that differential trace pair returns on the other traces in the differential trace pair.)

Thus, systems and methods have been described that provide for closer spacing of high speed differential trace pairs without the associated increases in crosstalk seen in conventional systems using trace stubs on at least one of the traces in each differential trace pair. The trace stubs operate to introduce a secondary crosstalk that negates a primary crosstalk generated by the high speed transmission of signals through the closely spaced high speed differential trace pairs, resulting in a lower total crosstalk generated in response to high speed signal transmission. The size, dimensions, and/or other characteristics of the stubs may be selected to "tune" the generation of secondary crosstalk based on circuit board details, differential trace pair details, etc., to attempt to minimize the total crosstalk generated when high speed signals are transmitted through the closely spaced differential trace pairs, which enables closer spacing of differential trace pairs with reduced crosstalk relative to conventional systems, allowing for denser circuit boards, circuit boards with fewer layers (i.e., due to the ability to utilize microstrip structures that traditionally are associated with increased crosstalk), and/or other benefits that would be apparent to one of skill in the art in possession of the present disclosure Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A method for providing high speed transmission on stubbed different trace pairs, comprising:

providing a first signal on a first differential trace pair that includes a first trace and a second trace and that is located on a circuit board, wherein a plurality of second trace stubs extend in a spaced apart orientation relative to each other and from a side of the second trace that is opposite from the first trace, and wherein the second trace includes a width that less than a width of the first trace;

providing a second signal on a second differential trace pair that includes a third trace and a fourth trace and that is located on the circuit board adjacent the first differential trace pair such that the second trace and the third trace are located between the first trace and the fourth trace, wherein a plurality of third trace stubs extend in a spaced apart orientation relative to each other and from a side of the third trace that is opposite from the fourth trace, and wherein the third trace includes a width that less than a width of the fourth trace; and reducing, using the plurality of second trace stubs and the plurality of third trace stubs, crosstalk generated by the providing of the first signal through the first differential trace pair and the providing of the second signal through the second differential trace pair.

2. A stubbed differential trace pair system, comprising:
a circuit board;
a first differential trace pair that includes a first trace and a second trace and that is located on the circuit board;
a plurality of second trace stubs that extend in a spaced apart orientation relative to each other and from a side of the second trace that is opposite from the first trace;
a second differential trace pair that includes a third trace and a fourth trace and that is located on the circuit board adjacent the first differential trace pair such that the second trace and the third trace are located between the first trace and the fourth trace; and
a plurality of third trace stubs that extend in a spaced apart orientation relative to each other and from a side of the third trace that is opposite from the fourth trace, wherein the plurality of second trace stubs and the plurality of third trace stubs are configured to reduce crosstalk generated by the transmission of signals through the first differential trace pair and the second differential trace pair, and wherein the first trace and the fourth trace are each free of stubs.

3. The system of claim 2, wherein at least 90% of signals transmitted on the first trace return on the second trace, and wherein at least 90% of signals transmitted on the third trace return on the fourth trace.

4. A stubbed differential trace pair system, comprising:
a circuit board;
a first differential trace pair that includes a first trace and a second trace and that is located on the circuit board;
a plurality of first trace stubs that extend in a spaced apart orientation relative to each other and from a side of the first trace that faces the second trace;
a plurality of second trace stubs that extend in a spaced apart orientation relative to each other and from a side of the second trace that is opposite from the first trace;
a second differential trace pair that includes a third trace and a fourth trace and that is located on the circuit board adjacent the first differential trace pair such that the second trace and the third trace are located between the first trace and the fourth trace;
a plurality of third trace stubs that extend in a spaced apart orientation relative to each other and from a side of the third trace that is opposite from the fourth trace; and
a plurality of fourth trace stubs that extend in a spaced apart orientation relative to each other and from a side of the fourth trace that faces the third trace, wherein the plurality of second trace stubs and the plurality of third trace stubs are configured to reduce crosstalk generated by the transmission of signals through the first differential trace pair and the second differential trace pair.

5. The system of claim 4, wherein 50% or less of signals transmitted on the first trace return on the second trace, and wherein 50% or less of signals transmitted on the third trace return on the fourth trace.

6. A stubbed differential trace pair system, comprising:
a circuit board;
a first differential trace pair that includes a first trace and a second trace and that is located on the circuit board, wherein the second trace includes a width that less than a width of the first trace;
a plurality of second trace stubs that extend in a spaced apart orientation relative to each other and from a side of the second trace that is opposite from the first trace;
a second differential trace pair that includes a third trace and a fourth trace and that is located on the circuit board adjacent the first differential trace air such that the second trace and the third trace are located between the first trace and the fourth trace, wherein the third trace includes a width that less than a width of the fourth trace; and
a plurality of third trace stubs that extend in a spaced apart orientation relative to each other and from a side of the third trace that is opposite from the fourth trace, wherein the plurality of second trace stubs and the plurality of third trace stubs are configured to reduce crosstalk generated by the transmission of signals through the first differential trace pair and the second differential trace pair.

7. A stubbed differential trace pair system, comprising:
a circuit board;
a first differential trace pair that includes a first trace and a second trace and that is located on the circuit board;
a plurality of second trace stubs that extend in a spaced apart orientation relative to each other and from a side of the second trace that is opposite from the first trace;
a second differential trace pair that includes a third trace and a fourth trace and that is located on the circuit board adjacent the first differential trace pair such that the second trace and the third trace are located between the first trace and the fourth trace; and
a plurality of third trace stubs that extend in a spaced apart orientation relative to each other and from a side of the third trace that is opposite from the fourth trace, wherein the plurality of second trace stubs and the plurality of third trace stubs are configured to reduce crosstalk generated by the transmission of signals through the first differential trace pair and the second differential trace pair, wherein each of the second trace stubs and each of the third trace stubs include a distal end having a semi-circular shape.

8. An information handling system (IHS), comprising:
a chassis;
a circuit board housed in the chassis;
a processing system mounted to the circuit board;
a memory system mounted to the circuit board and coupled to the processing system;
a first differential trace pair that includes a first trace and a second trace and that is located on the circuit board;
a plurality of second trace stubs that extend in a spaced apart orientation relative to each other and from a side of the second trace that is opposite from the first trace;
a second differential trace pair that includes a third trace and a fourth trace and that is located on the circuit board adjacent the first differential trace pair such that the second trace and the third trace are located between the first trace and the fourth trace; and
a plurality of third trace stubs that extend in a spaced apart orientation relative to each other and from a side of the third trace that is opposite from the fourth trace, wherein the plurality of second trace stubs and the plurality of third trace stubs are configured to reduce crosstalk generated by the transmission of signals through the first differential trace pair and the second differential trace pair, wherein the first trace and the fourth trace are each free of stubs.

9. The IHS of claim 8, wherein at least 90% of signals transmitted on the first trace return on the second trace, and wherein at least 90% of signals transmitted on the third trace return on the fourth trace.

10. An information handling system (IHS), comprising:
a chassis;
a circuit board housed in the chassis;
a processing system mounted to the circuit board;
a memory system mounted to the circuit board and coupled to the processing system;
a first differential trace pair that includes a first trace and a second trace and that is located on the circuit board;
a plurality of second trace stubs that extend in a spaced apart orientation relative to each other and from a side of the second trace that is opposite from the first trace;
a second differential trace pair that includes a third trace and a fourth trace and that is located on the circuit board adjacent the first differential trace air such that the second trace and the third trace are located between the first trace and the fourth trace; and
a plurality of third trace stubs that extend in a spaced apart orientation relative to each other and from a side of the third trace that is opposite from the fourth trace, wherein the plurality of second trace stubs and the plurality of third trace stubs are configured to reduce crosstalk generated by the transmission of signals through the first differential trace pair and the second differential trace pair, wherein each of the second trace stubs and each of the third trace stubs include a distal end having a semi-circular shape.

11. An information handling system (IHS), comprising:
a chassis;
a circuit board housed in the chassis;
a processing system mounted to the circuit board;
a memory system mounted to the circuit board and coupled to the processing system;
a first differential trace pair that includes a first trace and a second trace and that is located on the circuit board;
a plurality of first trace stubs that extend in a spaced apart orientation relative to each other and from a side of the first trace that faces the second trace;
a plurality of second trace stubs that extend in a spaced apart orientation relative to each other and from a side of the second trace that is opposite from the first trace;
a second differential trace pair that includes a third trace and a fourth trace and that is located on the circuit board adjacent the first differential trace pair such that the second trace and the third trace are located between the first trace and the fourth trace;
a plurality of third trace stubs that extend in a spaced apart orientation relative to each other and from a side of the third trace that is opposite from the fourth trace; and
a plurality of fourth trace stubs that extend in a spaced apart orientation relative to each other and from a side of the fourth trace that faces the third trace, wherein the plurality of second trace stubs and the plurality of third trace stubs are configured to reduce crosstalk generated by the transmission of signals through the first differential trace pair and the second differential trace pair.

12. The IHS of claim 11, wherein 50% or less of signals transmitted on the first trace return on the second trace, and wherein 50% or less of signals transmitted on the third trace return on the fourth trace.

13. An information handling system (IHS), comprising:
a chassis;
a circuit board housed in the chassis;
a processing system mounted to the circuit board;
a memory system mounted to the circuit board and coupled to the processing system;
a first differential trace pair that includes a first trace and a second trace and that is located on the circuit board, wherein the second trace includes a width that less than a width of the first trace;
a plurality of second trace stubs that extend in a spaced apart orientation relative to each other and from a side of the second trace that is opposite from the first trace;
a second differential trace pair that includes a third trace and a fourth trace and that is located on the circuit board adjacent the first differential trace pair such that the second trace and the third trace are located between the first trace and the fourth trace, wherein the third trace includes a width that less than a width of the fourth trace; and
a plurality of third trace stubs that extend in a spaced apart orientation relative to each other and from a side of the third trace that is opposite from the fourth trace, wherein the plurality of second trace stubs and the plurality of third trace stubs are configured to reduce crosstalk generated by the transmission of signals through the first differential trace pair and the second differential trace pair.

14. A method for providing high speed transmission on stubbed different trace pairs, comprising:
providing a first signal on a first differential trace pair that includes a first trace and a second trace and that is located on a circuit board, wherein a plurality of first trace stubs extend in a spaced apart orientation relative to each other and from a side of the first trace that faces the second trace, and wherein a plurality of second trace stubs extend in a spaced apart orientation relative to each other and from a side of the second trace that is opposite from the first trace;
providing a second signal on a second differential trace pair that includes a third trace and a fourth trace and that is located on the circuit board adjacent the first differential trace pair such that the second trace and the third trace are located between the first trace and the fourth trace, wherein a plurality of third trace stubs extend in a spaced apart orientation relative to each other and from a side of the third trace that is opposite from the fourth trace, and wherein a plurality of fourth trace stubs extend in a spaced apart orientation relative to each other and from a side of the fourth trace that faces the third trace; and
reducing, using the plurality of first trace stubs, the plurality of second trace stubs, the plurality of third trace stubs, and the plurality of fourth trace stubs, crosstalk generated by the providing of the first signal through the first differential trace pair and the providing of the second signal through the second differential trace pair.

15. The method of claim 14, wherein 50% or less of the first signal transmitted on the first trace returns on the second trace, and wherein 50% or less of the second signal transmitted on the third trace returns on the fourth trace.

16. A method for providing high speed transmission on stubbed different trace pairs, comprising:
providing a first signal on a first differential trace pair that includes a first trace and a second trace and that is located on a circuit board, wherein a plurality of second trace stubs extend in a spaced apart orientation relative to each other and from a side of the second trace that is opposite from the first trace;

providing a second signal on a second differential trace pair that includes a third trace and a fourth trace and that is located on the circuit board adjacent the first differential trace pair such that the second trace and the third trace are located between the first trace and the fourth trace, wherein a plurality of third trace stubs extend in a spaced apart orientation relative to each other and from a side of the third trace that opposite from the fourth trace; and reducing, using the plurality of second trace stubs and the plurality of third trace stubs, crosstalk generated by the providing of the first signal through the first differential trace pair and the providing of the second signal through the second differential trace pair, wherein the first trace and the fourth trace are each free of stubs.

17. The method of claim 16, wherein at least 90% of the first signal transmitted on the first trace returns on the second trace, and wherein at least 90% of the second signal transmitted on the third trace returns on the fourth trace.

* * * * *